US011835607B2

(12) United States Patent
Stautner

(10) Patent No.: US 11,835,607 B2
(45) Date of Patent: Dec. 5, 2023

(54) AUXILIARY CRYOGEN STORAGE FOR MAGNETIC RESONANCE IMAGING APPLICATIONS

(71) Applicant: General Electric Company, Schenectady, NY (US)

(72) Inventor: Ernst Wolfgang Stautner, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 790 days.

(21) Appl. No.: 16/928,858

(22) Filed: Jul. 14, 2020

(65) Prior Publication Data

US 2022/0018920 A1    Jan. 20, 2022

(51) Int. Cl.
  *G01R 33/385*  (2006.01)
  *F17C 7/04*  (2006.01)

(52) U.S. Cl.
  CPC ............ *G01R 33/3856* (2013.01); *F17C 7/04* (2013.01); *F17C 2221/017* (2013.01); *F17C 2227/0337* (2013.01); *F17C 2270/0536* (2013.01)

(58) Field of Classification Search
  CPC ............ G01R 33/3856; G01R 33/3815; G01R 33/3804; F17C 7/04; F17C 2221/017; F17C 2227/0337; F17C 2270/0536; F17C 3/085; F17C 13/007; H01F 6/04
  See application file for complete search history.

(56) References Cited

U.S. PATENT DOCUMENTS

| 4,872,314 | A | | 10/1989 | Asano | |
|---|---|---|---|---|---|
| 5,594,401 | A | * | 1/1997 | Dorri | G01R 33/3815 324/319 |
| 5,651,256 | A | * | 7/1997 | Herd | H01F 6/04 62/51.1 |
| 7,298,602 | B2 | | 11/2007 | Knight | |
| 8,893,516 | B2 | | 11/2014 | Tsuda | |
| 10,184,711 | B2 | | 1/2019 | Stautner et al. | |
| 2008/0229928 | A1 | * | 9/2008 | Urbahn | F04B 37/02 96/146 |
| 2008/0242974 | A1 | | 10/2008 | Urbahn et al. | |
| 2011/0101982 | A1 | * | 5/2011 | Huang | G01R 33/3804 324/318 |

(Continued)

FOREIGN PATENT DOCUMENTS

| GB | 2426317 B | 10/2007 |
|---|---|---|
| JP | 2010523204 A | 7/2010 |

(Continued)

OTHER PUBLICATIONS

Stautner, W et al. "Hydrogen Cooling Options for MgB2-based Superconducting Systems." AIP conference proceedings vol. 1573, 1 (2014): 82-90 (Year: 2014).*

(Continued)

*Primary Examiner* — Daniel R Miller

(57) ABSTRACT

The present disclosure relates to a cooling system that includes a superconducting unit and a reservoir configured to store liquid coolant to cool the superconducting unit. The cooling system also includes an auxiliary storage system that includes one or more storage tanks fluidly coupled to the reservoir. The auxiliary storage system is configured to provide additional coolant to the reservoir as well as receive and store coolant from the reservoir.

16 Claims, 2 Drawing Sheets

(56) References Cited

U.S. PATENT DOCUMENTS

2011/0179809 A1* 7/2011 Zhang .................. H01F 6/04
                                                    62/51.1
2012/0028805 A1    2/2012  Hollis
2016/0189841 A1    6/2016  Li et al.

FOREIGN PATENT DOCUMENTS

JP          4537270 B2      9/2010
JP         2012030071 A     2/2012
WO      WO-2018065458 A1 *  4/2018  ............ F25B 25/005

OTHER PUBLICATIONS

UK patent application 2109775.3 filed Jul. 6, 2021—Combined Search and Examination Report dated Dec. 13, 2021 ; 6 pages.
Iwasa, Yukikazu, et al.; "Solid-Cryogen Cooling Technique for Superconducting Magnets of NMR and MRI", Physics Procedia, 2012, pp. 1348-1353, vol. 36.
Claudet, S., et al.; "Helium Inventory Management and Losses for LHC Cryogenics", Physics Procedia, 2015, pp. 66-71, vol. 67.
JP patent application 2021-081999 filed May 13, 2021—Office Action dated Jun. 29, 2022; Machine Translation; 4 pages.

* cited by examiner

AUXILIARY CRYOGEN STORAGE FOR MAGNETIC RESONANCE IMAGING APPLICATIONS

STATEMENT REGARDING FEDERALLY SPONSORED RESEARCH & DEVELOPMENT

This invention was made with Government support under contract number 1U01EB026976 awarded by the National Institutes of Health (NIH). The Government has certain rights in the invention.

BACKGROUND

The subject matter disclosed herein relates to industrial and cryogenic cooling, and more specifically, to techniques for providing coolant on-demand to systems such as imaging systems.

Cooling may be used in a variety of industrial and cryogenic applications. In many cases, systems can be cooled using a coolant (e.g., a liquid cryogen such as liquid helium) that is supplied to the system. For example, magnets in magnetic resonance imaging (MRI) systems may be cooled by the coolant during operation of the MRI system. In some cases, the amount of coolant desired for cooling the system may fluctuate. For example, during relatively higher load situations, such as during start-up of the system, more coolant may be desired relative to the amount of coolant used during normal operation of the MRI system.

BRIEF DESCRIPTION

In one embodiment, a cooling system includes a superconducting unit and a reservoir configured to store liquid coolant to cool the superconducting unit. Additionally, the cooling system includes an auxiliary storage system that includes one or more storage tanks fluidly coupled to the reservoir. The auxiliary storage system is configured to provide additional coolant to the reservoir as well as receive and store coolant from the reservoir.

In another embodiment, an imaging system includes a superconducting unit, a thermal shield configured to shield the superconducting unit from thermal radiation, and a reservoir configured to store liquid coolant to cool the superconducting unit. Additionally, the image system includes an auxiliary storage system that includes one or more storage tanks fluidly coupled to the reservoir. The auxiliary storage system is configured to provide additional coolant to the reservoir as well as receive and store coolant from the reservoir.

In yet another embodiment, a method includes providing coolant to a first thermal switch of an auxiliary storage system that includes one or more storage tanks fluidly coupled to a reservoir configured to store liquid coolant used to cool a superconducting unit. Providing coolant to the first thermal switch causes a first tank of the one or more storage tanks to become thermally coupled to a thermal shield. The method also includes performing a ramp-up of the superconducting unit and providing coolant from the first tank to the reservoir in response to a temperature increase caused by performing the ramp-up.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
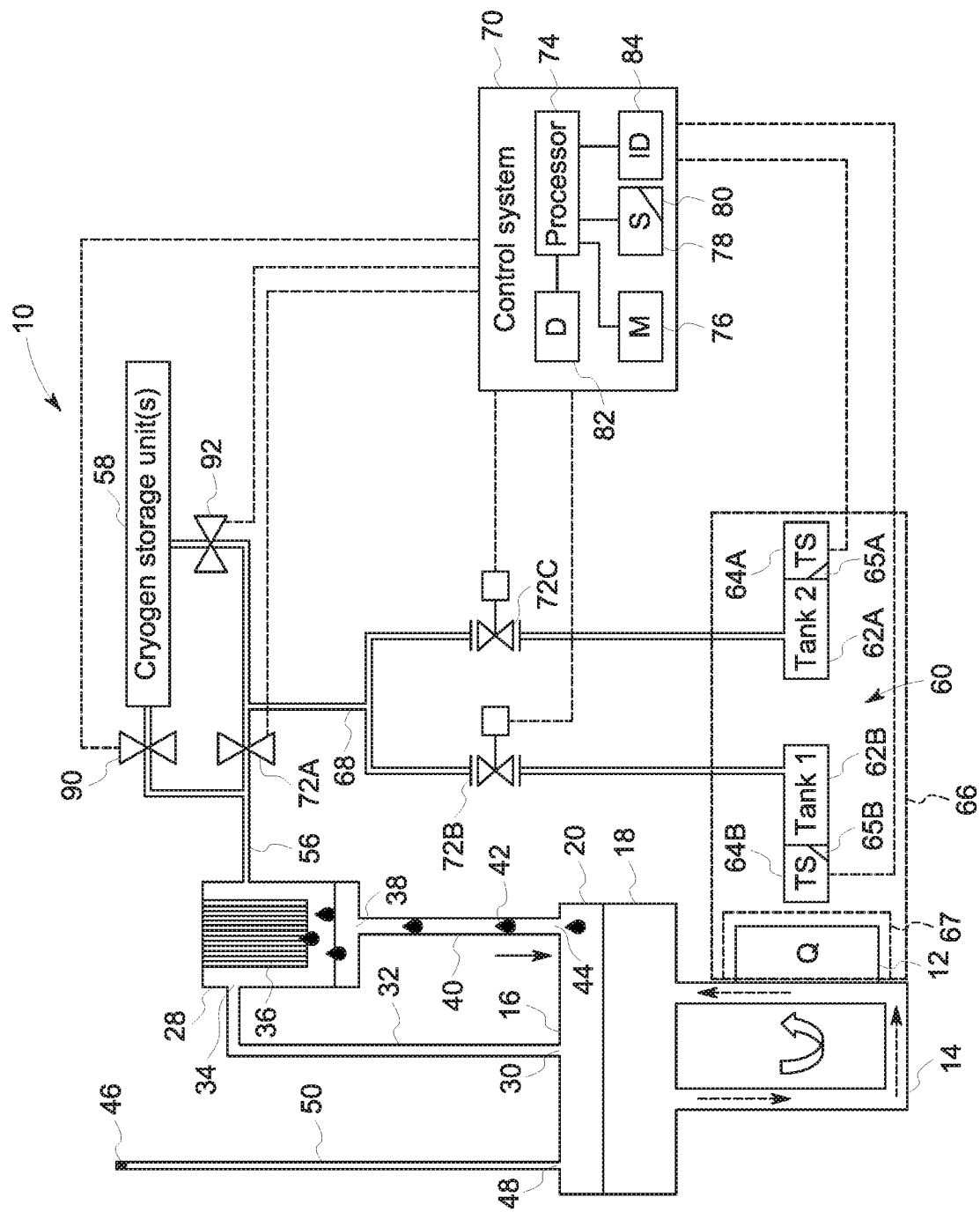
FIG. 1 is a block diagram of a thermosiphon cooling system, in accordance with an embodiment.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Cooling may be used in a variety of industrial and cryogenic applications. For example, cryogenic cooling may be used in nuclear magnetic resonance imaging spectroscopy, magnetic resonance imaging (MRI), nuclear fusion, superconducting drives, motors and generators, accelerator magnet systems, forward-looking infrared systems, food storage, manufacturing processes, and recycling. In many cases, cooling is accomplished using fluids that are gases under standard temperature and pressure conditions. For example, many cooling applications involve the use of liquid helium, liquid hydrogen, liquid neon and/or liquid nitrogen or mixtures thereof. In many cases involving cooling, fluids are stored in storage tanks or vessels, and the fluids are later distributed or removed to be used to cool a system or a component of a system. Additionally, a system that is cooled may experience different operating conditions in which different amounts of coolant are utilized to cool the system. In certain cases, supplying additional coolant to the system may ultimately generate gas (e.g., liquid coolant evaporating into a gas due to being heated) that is dispelled by a system. Moreover, a source of the coolant (e.g., gas cylinders storing coolant) may need to be replaced, for example, after all of the coolant has been provided to the system being cooled. The present disclosure provides systems and methods that allow for cooling fluids to be provided on-demand to systems that are cooled by coolants, such as cryogenic fluids. More specially, the techniques discussed below may enable systems to operate using smaller coolant sources while still being able to provide the system to be cooled with increased volumes of coolant, for example, when operating in conditions that utilize relatively higher amounts of coolant.

Keeping the foregoing in mind, particularly that the systems and methods described below may be used for a wide variety of cooling applications, FIG. 1 is a schematic diagram of a thermosiphon cooling system 10 that may be used to cool a superconducting unit 12 of a magnetic resonance imaging (MRI) system. However, it should be noted that the implementation of the thermosiphon cooling system 10 is not limited to MRI systems, and may be implemented in other devices, such as superconducting electrical machines, superconducting magnet energy storage systems (SMES), superconducting (SC) accelerators, and the like. The thermosiphon cooling system 10 may be configured to maintain a temperature of the superconducting unit 12 at or below a cryogenic temperature. The superconducting unit 12 may include superconducting magnets and/or coils, a gradient system, and their supporting structure held within the MRI system. Particularly, the thermosiphon cooling system 10 is configured to cool or dissipate heat from the superconducting unit 12 so that the temperature associated with the superconducting unit 12 is maintained at or below the cryogenic temperature. The term "cryogenic temperature" is used to refer to a temperature at or below which the superconducting unit 12 is designed to operate in a superconducting state. In one embodiment, the cryogenic temperature may be in a range from about 2.5 K to about 5 K.

As illustrated, the thermosiphon cooling system 10 includes a tubing unit 14 configured to absorb heat generated by the superconducting unit 12. The tubing unit 14 may also include a liquid coolant, which may absorb heat from the tubing unit 14. The liquid coolant may include helium, hydrogen, neon, nitrogen, or combinations thereof. The liquid coolant may also be stored in a reservoir 16, which includes a first portion 18 that includes the liquid coolant and a second portion 20 that does not include the liquid coolant. The liquid coolant may flow exit the reservoir 16, flow into the tubing unit 14, exit the tubing unit 14, and reenter the reservoir 16.

The liquid coolant in the first portion 18 of the reservoir 16 may absorb heat from the tubing unit 14. As the liquid coolant in the reservoir 16 absorbs heat from the tubing unit 14, some of the liquid coolant may evaporate, enter a condensing unit 28 in which the evaporated coolant is cooled such that the evaporated coolant condenses to become liquid coolant, and the liquid coolant may reenter the reservoir 16. More specifically, the evaporated coolant may exit the reservoir 16 via an outlet 30, travel through a channel 32, and exit the channel 32 via an outlet 34 into the condensing unit 28. The condensing unit 28 may include a condenser 36, and the condenser 36 may condense the evaporated coolant to form liquid coolant. The liquid coolant in the condensing unit 28 may exit the condensing unit 28 via an outlet 38, pass through a channel 40, and exit the channel 40 to enter the reservoir 16. As illustrated, the liquid coolant may form as droplets 42, and the droplets 42 may exit the channel 40 via outlet 44 and enter the reservoir 16.

Additionally, pressure in the reservoir 16 (e.g., caused by the evaporation of the liquid coolant) may be released via a release valve 46. That is, gas within the reservoir 16 may exit the reservoir 16 via an outlet 48, pass through a channel 50, and exit the channel 50 via the release valve 46.

Coolant, which may be a cooling fluid such as a cryogenic gas, can be supplied to the reservoir 16 from several sources. More specifically, the condenser unit 28 may be supplied with coolant via a connection 56 that fluidly couples the condenser unit 28 to one or more cryogen storage units 58 and an auxiliary cryogen storage system 60. The cryogen storage units 58 may include storage tanks that store cryogenic gas to the tubing unit 14. In the illustrated embodiment, the cryogenic gas may be any of the same elements as the liquid coolant (e.g., helium, hydrogen, neon, nitrogen, or combinations thereof). In other embodiments, the cryogenic gas may be other fluids, such as compressed natural gas or liquefied natural gas. It should be noted that, in some embodiments, the cryogen storage units 58 may not be included in the thermosiphon cooling system 58, or the cryogen storage units 58 may only temporarily be included in the thermosiphon cooling system 10. For example, the cryogen storage units 58 may be utilized to provide coolant to the auxiliary cryogen storage system 60 before being removed from the thermosiphon cooling system 10.

The auxiliary cryogen storage system 60 may also be fluidly coupled to the reservoir 16 and the cryogen storage units 58 via the connection 56. The auxiliary cryogen storage system 60 may provide additional cryogen auxiliary cryogen storage system 60 for the thermosiphon cooling system 10 as well as receive coolant from the reservoir 16. For example, the auxiliary cryogen storage system 60 includes storage tanks 62 (e.g., first storage tank 62A and second storage tank 62B) which may store coolant, such as cryogenic fluid (e.g., in liquid and/or gas phases). More specifically, the storage tanks 62 may include a first tank 62A and a second tank 62B that, in addition to coolant, may include an adsorptive material such as carbon (e.g., activated charcoal or graphene layers used for physisorption) or zeolites to increase the amount of the coolant that the first tank 62A and second tank 62B can store in gaseous form. In one embodiment, the first tank 62A and the second tank 62B each include approximately seven kilograms of activated charcoal, and the storage tanks 62 may store approximately ten liters of liquid coolant (e.g., liquid helium) and approximately 6,600 liters of gaseous coolant at room temperature. As discussed below, the auxiliary cryogen storage system 60 may provide the coolant stored in the storage tanks 62A, 62B to the reservoir 16 as well as receive coolant from the reservoir 16 and store the received coolant in the auxiliary cryogen storage system 60. In other words, coolant that is stored in the storage tanks 62A, 62B (e.g., in liquid form or adsorbed in gaseous form by the adsorptive material) can be provided to the reservoir 16 (and tubing unit 14) to cool the superconducting unit 12, for example, during relatively high-load situations such as when an MRI system is ramping up or when running Mill sequences with high magnet gradient interaction (MGI).

The auxiliary cryogen storage system 60 also includes thermal switches 64 (e.g., first thermal switch 64A and second thermal switch 64B), which may be gas gap heat switches that include or are fluidly coupled to sorbs 65 (e.g., first sorb 65A and second sorb 65B) that may store relatively small amounts of coolant (e.g., less than one liter of liquid coolant). The gas gap switches of the thermal switches 64A, 64B may include finned structures that interlace with one another. Depending on the temperature of the thermal switches 64A, 64B (or coolant stored therein), the thermal switches 64A, 64B may be opened or closed. By opening and closing the thermal switches 64, 64B, thermal connections to the respective storage tanks 62A, 62B may be established and terminated. For example, sorbs 65A, 65B may include or be fluidly coupled to one or more coolant sources that may be cooled by a cryocooler. The sorbs 65A, 65B may be evacuated of coolant to place the sorbs 65A, 65B in an "off" state in which no thermal connection between the thermal switches 64A, 64B and another component of the thermosiphon cooling system 10 will exist. However, when coolant is added to the sorbs 65A, 65B, a thermal connection between the storage tanks 62A, 62B and other components of the thermosiphon cooling system 10 can be established via the thermal switches 64A, 64B. In other words, the thermal switches 64A, 64B may be utilized to make and break thermal connections between the storage tanks 62A, 62B and other components included in the thermosiphon cooling system 10. By establishing or terminating thermal connections using the thermal switches 64A, 64B, the temperatures within the storage tanks 62A, 62B can be changed. As discussed in more detail below, by changing the temperature within the storage tanks 62A, 62B, coolant may flow into or out of the tanks 62A, 62B.

In particular, the thermal switch 64A may be thermally coupled to the first tank 62A and a thermal shield 66. The thermal shield 66 may surround portions of the thermosiphon cooling system 10, such as the superconducting unit 12, and shield the portions of the thermosiphon cooling system 10 from thermal radiation. In some embodiments, the temperature of the thermal shield may be approximately 30 K to 50 K. By supplying coolant to the sorb 65A (e.g., to place the thermal switch 64A in an "on" state), a thermal connection between the first tank 62A and the thermal shield 66 is established via the thermal switch 64A. Conversely, when the thermal switch 64A is in an "off" state (e.g., when coolant has been evacuated from the sorb 65A), no thermal connection between the storage tank 62A and the thermal shield 66 will be present.

The thermal switch 64B is thermally coupled to the second tank 62B and a cooling system 67. The cooling system 67 may be linked to the superconducting unit 12 and cools the superconducting unit 12. By supplying coolant to the sorb 65B (e.g., to place the thermal switch 64B in an "on" state), a thermal connection between the second tank 62B and the cooling system 67 is established via the thermal switch 64B. When the thermal switch 64B is in an "off" state (e.g., when coolant has been evacuated from the sorb 65B), no thermal connection between the second storage tank 62B and the thermal shield 66 will be present.

Coolant, when being added to the storage tanks 62, may pass from the connection 56 to the connection 68 and into the first tank 62A and second tank 62B. Similarly, when coolant is provided to the reservoir 16 from the auxiliary cryogen storage system 60, the coolant flows from the storage tanks 62 into the connection 68. From the connection 68, the coolant flows into the connection 56 and the condensing unit 28. For example, in cases in which coolant (e.g., gaseous coolant) is provided from the auxiliary cryogen storage system 60, the condensing unit 28 receives the coolant and condenses the coolant to produce liquid coolant that is provided to the reservoir 16 via the channel 40.

In particular, the thermal switches 64A, 64B may be opened and closed to change the temperature within the auxiliary cryogen storage system 60 (e.g., within the storage tanks 62). In other words, the thermal switches 64A, 64B can be utilized to change the temperature of the coolant within the auxiliary cryogen storage system 60. To raise the temperature within the auxiliary cryogen storage system 60, the switch 64A may be utilized. Conversely, to lower the temperature within auxiliary cryogen storage system 60, the switch 64B may be utilized.

Adjusting the temperature within the auxiliary cryogen storage system 60 causes coolant to flow into or out of the auxiliary cryogen storage system 60 (depending on the temperature change). For example, as the temperature increases within the storage tanks 62 of the auxiliary cryogen storage system 60, the pressure within the storage tanks 62 will increase, for instance, due to liquid coolant evaporating into gaseous coolant. Due to a temperature and/or pressure gradient between the storage tanks 62, and the reservoir 16, coolant may flow from the storage tanks 62 to the reservoir 16. As another example, the opposite may occur when the temperature within the auxiliary cryogen storage system 60 is lowered. For example, lowering the temperature within the auxiliary cryogen storage system 60 may cause coolant to return from the reservoir 16 to the auxiliary cryogen storage system 60 and be stored within the storage tanks 62.

As illustrated, the thermosiphon cooling system 10 also includes a control system 70 and several valves 72A, 72B, 72C (e.g., solenoid valves) that are communicatively coupled to the control system 70. More specifically, the control system 70 may include processing circuitry 74 that controls the position of the valves 72A, 72B, 72C and the thermal switches 64A, 64B by executing computer-readable instructions that may be stored on memory 76 or storage 78 communicatively coupled to the processing circuitry 74. The processing circuitry 74 may include one or more general purpose microprocessors, one or more application specific processors (ASICs), one or more field programmable logic arrays (FPGAs), or any combination thereof. The memory 76 and/or the storage device 78 may be tangible, non-transitory, computer-readable mediums that store instructions executable by and data to be processed by the processing circuitry 74. For example, the memory 76 may include random access memory (RAM), and the storage 78 may include read only memory (ROM), rewritable non-volatile memory such as flash memory, hard drives, optical discs, and the like. By way of example, a computer program product containing the instructions may include an operating system or an application program. For instance, in the illustrated embodiment, the storage 78 includes an application 80 for controlling operation of the thermosiphon cooling system 10. More specifically, the processing circuitry 74 may execute the application 80 in to control the positions of the valves 72A, 72B, 72C and thermal switches 64A, 64B in accordance with various modes of operation of the thermosiphon cooling system 10 discussed below.

The control system 70 may also include a display 82 and one or more input devices 84 that are communicatively coupled to the processing circuitry 74. The display 82 may present a graphical user interface (GUI) to a user of the control system 70, and the user may interact with the GUI using the input devices 84 in order to control the operation of the control system 70. The input devices enable users to interact with the control system 70, for instance, to select a mode of operation or to manually set that positions of the values 72A, 72B, 72C and/or the switches 64A, 64B. The input devices 84 may include buttons, keyboards, mice, trackpads, and/or the like. Additionally or alternatively, the display 82 may include touch components that enable user inputs to the control system 70 by detecting occurrence and/or position of an object touching its screen (e.g., surface of the electronic display 82).

The coolant stored by the auxiliary cryogen storage system 60 may be provided to or from reservoir 16 depending on the operating conditions of the thermosiphon cooling system 10. More specifically, as described below, after the thermosiphon cooling system 10 is initially filled with coolant, the thermosiphon cooling system 10 may operate in a low-volume mode and a high-volume mode. The low-volume mode corresponds to regular operation of the thermosiphon cooling system 10, such as when the thermosiphon cooling system 10 is operating in a steady state. For example when the superconducting unit 12 of an MRI system is idle (e.g., not being used or when already in a superconducting state) or being utilized to during normal use of the MRI system (e.g., when collecting MRI data), the thermosiphon cooling system 10 may operate in a low-volume mode in which an amount of coolant utilized by the thermosiphon cooling system 10 is relatively less than an amount of coolant utilized during the high-volume mode. The high-volume mode of operation generally corresponds to periods of time in which there is a higher demand on the superconducting unit 12, thereby causing more coolant to be used to cool the superconducting unit 12. As an example, the high-volume mode of operation may be utilized when an MRI system is ramping up (e.g., initializing), ramping down, when the MRI system will be utilized for an extended period of time, and when the MRI system is performing MGI sequences (e.g., MGI sequences that could cause high heat spikes). When the thermosiphon cooling system 10 is operating in the high-volume mode, the auxiliary cryogen storage system 60 may provide coolant to the reservoir 16. Furthermore, while the thermosiphon cooling system 10 is operating in the low-volume mode, the auxiliary cryogen storage system 60 may not supply coolant to the reservoir but may receive coolant. Before discussing the high-volume and low-volume modes of operation in more detail, filling the thermosiphon cooling system 10 will first be discussed.

Figure 2:
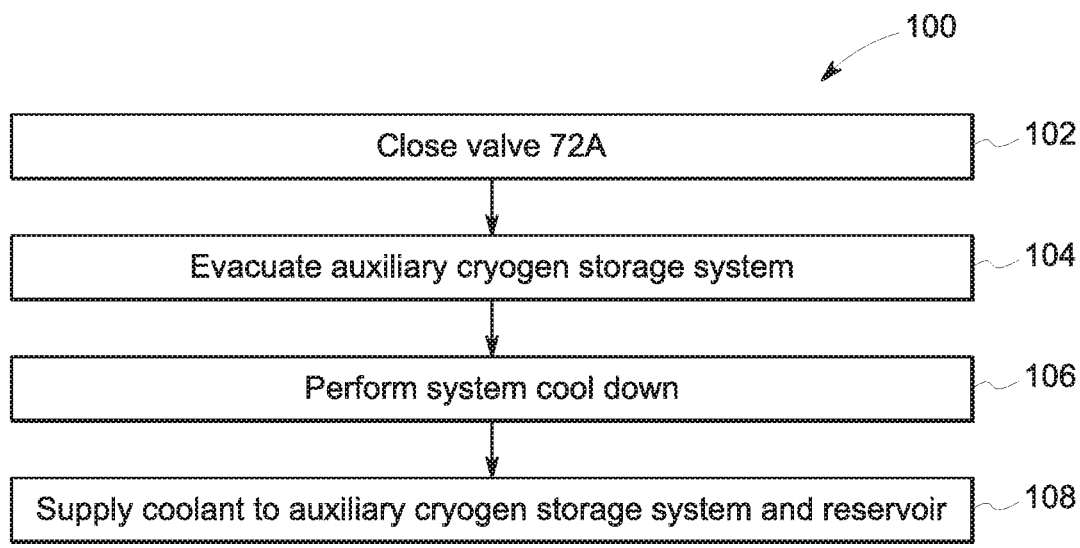
FIG. 2 is a flow diagram of a process for performing an initial fill of the thermosiphon cooling of FIG. 1 with coolant, in accordance with an embodiment.

More specifically, performing an initial fill of the thermosiphon cooling system 10 with coolant will now be discussed with respect to FIG. 2. In particular, FIG. 2 illustrates a flow diagram of a process 100 for performing an initial fill of the thermosiphon cooling system 10 with coolant. The thermosiphon cooling system 10 may perform the process 100 in response to the control system 70 receiving user input (e.g., via the input devices 84) indicative of a request to launch an initialization process.

At process block 102, the valve 72A is closed. For example, the control system 70 may send a command to close the valve 72A, the valve 72A may close in response to receiving such a command. By closing the valve 72A, the fluid path (e.g., via connection 56) between the storage tanks 62A, 62B of the auxiliary cryogen storage system 60 and the reservoir 16 is closed.

At process block 104, the storage tanks 62A, 62B of the auxiliary cryogen storage system 60 are evacuated, meaning coolant stored in the auxiliary cryogen storage system 60 is removed from the auxiliary cryogen storage system 60. For example, the auxiliary cryogen storage system 60 may include one or more pumps that cause the cryogen stored in the storage tanks 62A, 62B to be drawn from out of the storage tanks 62A, 62B. Additionally, or alternatively, a pressure differential between the pressure inside of the storage tanks 62A, 62B and outside of the storage tanks 62A, 62B may be harnessed to cause the coolant within the storage tanks 62A, 62B to be drawn out of the storage tanks 62A, 62B.

At process block 106, the thermosiphon cooling system 100 may perform a system cooldown in which the thermosiphon cooling system 10 is cooled down to an operating temperature a near-operating temperature. For example, the components of the thermosiphon cooling system 10 may be cooled to approximately 4 K.

At process block 108, coolant may be supplied to the auxiliary cryogen storage system 60 and the reservoir 16. In particular, coolant from the cryogen storage units 58 may be supplied to the storage tanks 62A, 62B of the auxiliary cryogen storage system 60 as well as to the reservoir 16. For example, with respect to providing coolant to the reservoir 16, gaseous coolant may be provided to the condenser unit 28 in response to the control system 70 sending a command to open a valve 90. The coolant may condense the gaseous coolant into liquid coolant that is provided to the reservoir 16 via channel 40. The coolant may be supplied to the storage tanks 62A, 62B in response to the control system 70 sending a command to open a valve 92 to enable coolant to flow from the cryogen storage units 58 to the storage tanks 62A, 62B.

Figure 3:
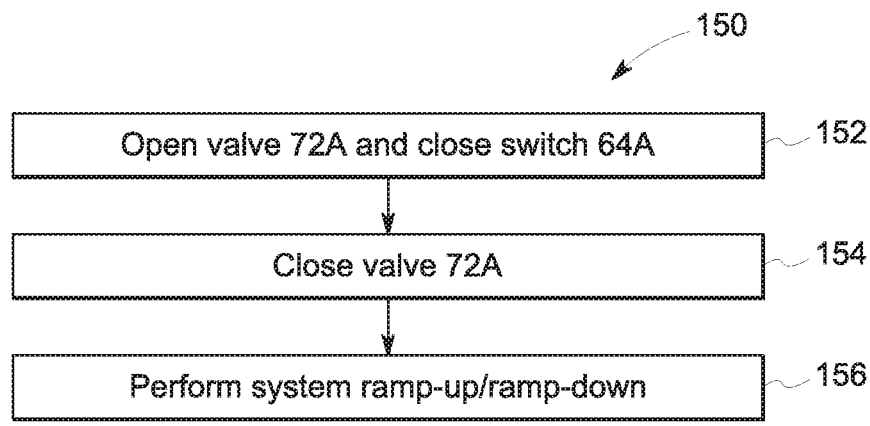
FIG. 3 is a flow diagram of a process for operating the thermosiphon cooling system of FIG. 1 in the high-volume mode of operation, in accordance with an embodiment.

Once the coolant has been supplied to the reservoir 16 and the auxiliary cryogen storage system 60 of the thermosiphon cooling system 10, the low-volume and high-volume modes of operation may be utilized. As discussed below, in each of these modes, the temperature within the auxiliary cryogen storage system 60 may be modified (e.g., by adjusting the states of thermal switches 64A, 64B to establish or end thermal connections between components of the thermosiphon cooling system 10). The change in temperature may cause coolant to be supplied to the reservoir 16 or received from the reservoir 16. Bearing this in mind, FIG. 3 is a flow diagram of a process 150 for operating the thermosiphon cooling system 10 in the high-volume mode of operation. The process 150 may be performed by the control system 70 controlling the thermosiphon cooling system 10 in response to receiving a user input indicative of a request to operate the thermosiphon cooling system 10 in the high-volume mode. For example, the control system 70 may receive a request to ramp up or ramp down the thermosiphon cooling system 10. In request to the request, the process 150 may be performed.

At process block 152, the valve 72A is opened and the thermal switch 64A is filled with coolant and closed. For example, the control system 70 may send a command to open the valve 72A, the valve 72A may open in response to receiving such a command. By opening the valve 72A, the fluid path (e.g., via connections 56, 68) between the storage tanks 62A, 62B of the auxiliary cryogen storage system 60 and the reservoir 16 is opened. Additionally, control system 70 may send a command to cause the thermal switch 64B to close (in an evacuated state). Because the thermal switch 64A includes coolant, the thermal switch 64A will become thermally conducting, which may cause the temperature of the auxiliary cryogen storage system 60 (e.g., within the first tank 62A) to change to approximately 30 K due to the thermal connection between the first tank 62A and the thermal shield 66. If performing the process 150 after performing the process 100, this will be a temperature increase (e.g., from 4 K to 30 K). Due to the temperature increase, coolant (e.g., is gaseous form) from the auxiliary cryogen storage system 60 will be supplied to the condensing unit 28, which will condense the gaseous coolant into liquid coolant and provide the liquid coolant to the reservoir 16.

At process block 154, the valve 72A is closed. This may be performed in the same manner as discussed above with respect to process block 102 of the process 100.

At process block 156, a system ramp-up or ramp-down may be performed. In other words, the superconducting unit 12 may be prepared to become superconducting (e.g., when performing a ramp-up) or to no longer operate in a superconductive loop (e.g., when performing a ramp-down). During this operation, liquid coolant from the reservoir 16 may be heated, causing some of the liquid coolant 16 to become gaseous coolant. If it is desirable to add more coolant to the reservoir 16, coolant may be supplied from the cryogen storage units 58 to the reservoir 16. In either case, the cryogen storage units 58 may receive gaseous coolant from the reservoir 16. As discussed below, the coolant may be provided to the storage tanks 62A, 62B of the auxiliary cryogen storage system 60 while operating in low-volume mode. However, before continuing, it should be noted that the operations described above with respect to process block 156 may also be performed when an MRI system is being used for extended periods of time or performing MGI sequences.

As the temperature of the thermal shield 66 increases (e.g., due to eddy currents generated during ramp-up or while performing MGI sequences), coolant will be provided from the first tank 62A based on the degree of the temperature increase. For instance, because the thermal switch 64 is thermally conducting, a thermal connection between the first tank 62A and the thermal shield 66 is established. The higher the temperature of the thermal shield 66 increases, the more rapidly the temperature within the first tank 62A will increase. The more rapidly the temperature within the first tank 62A increases, the higher the rate of the liquid coolant stored within the first tank 62 evaporating will be. And, as more gaseous coolant forms, the higher the amount of the coolant will be provided from the first tank 62A to the condensing unit 28. Thus, coolant is provided from the auxiliary storage system 60 based on the demand for coolant of the thermosiphon cooling system 10. In other words, coolant may automatically be provided from the auxiliary storage system 60 due to there being a temperature increase within the thermosiphon cooling system 10 (e.g., caused by performing a ramp-up or MGI sequences). Thus, the auxiliary storage system 60 can provide coolant to the condensing unit 28 independent of the control system 70. That is, the first tank 62A may provide coolant to the condensing unit 28 without the control system providing a command (e.g., made in response to a detected temperature increase) to provide coolant to the condensing unit 28.

Figure 4:
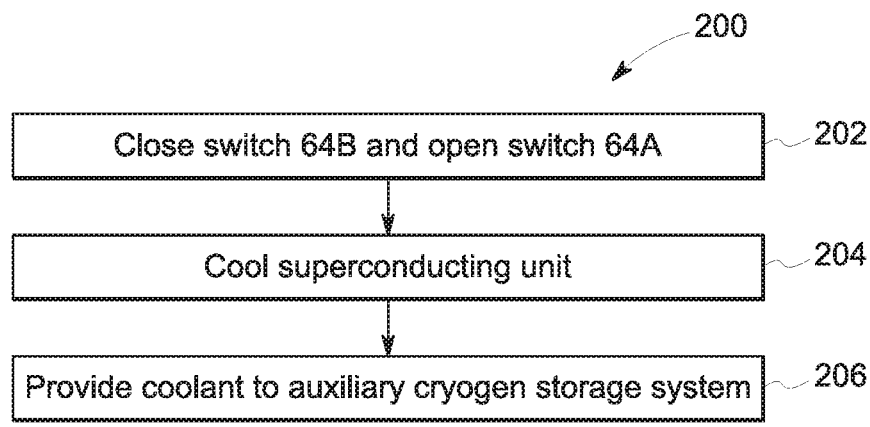
FIG. 4 is a flow diagram of a process for operating the thermosiphon cooling system of FIG. 1 in the low-volume mode of operation, in accordance with an embodiment.

In the case in which the high-volume mode is utilized (e.g., to perform a ramp-up), the user of the MRI system may desire to operate the thermosiphon cooling system 10 in the low-volume mode (e.g., once the ramp-up has finished). In other words, once ramp-up has finished, less coolant may be utilized to cool the superconducting unit 12 relative to the amount of coolant used during ramp-up. With this in mind, FIG. 4 is a flow diagram of a process 200 for operating the thermosiphon cooling system 10 in the low-volume mode of operation. The process 200 may be performed by the control system 70 controlling the thermosiphon cooling system 10 in response to receiving a user input indicative of a request to operate the thermosiphon cooling system 10 in the low-volume mode. For example, the control system 70 may perform the process 200 in response to determining that a ramp-up is complete or in response to receiving a request (e.g., via the input devices 84) to operate the thermosiphon cooling system 10 in the low-volume mode. In request to the request, the process 200 may be performed.

At process block 202, the thermal switch 64A is opened, and thermal switch 64B is closed to cause the temperature within the auxiliary cryogen storage system 60 to decrease, for example, to approximately 4 K. In other words, coolant may be evacuated from the sorb 65A so that the thermal switch 64A will not be thermally conducting. Coolant is provided to the sorb 65B to cause the thermal switch 64B to become thermally conducting. Due to the first tank 62A not being thermally coupled to the thermal shield 66, the temperature in the first tank 64A will decrease (e.g., from 30 K to 4 K). Because the thermal switch 64B is thermally conducting, a thermal connection between the second tank 64B and the cooling system 67 will be established. Coolant will be replenished within the first tank 62A, while the second tank 62B may provide coolant to the condensing unit 28 should there by an increase in temperature (e.g., within the cooling system 67). Similar to the discussion above related to the first tank 62A, the second tank 62B may automatically provide coolant to the condensing unit 28 in response to a temperature increase. That is, the second tank 62B may provide coolant to the condensing unit 28 without the control system providing a command (e.g., made in response to a detected temperature increase) to provide coolant to the condensing unit 28. The positions of the thermal switches 64A, 64B may be modified by the control system 70 sending commands to the thermal switches 64A, 64B to adjust positions (e.g., from open to closed or from closed to open). In response to such commands, the thermal switch 64A may be opened, and the thermal switch 64B may be closed.

At process block 204, the superconducting unit 12 may be cooled. For example, the superconducting unit 12 may be cooled to a temperature of approximately 2.5 K to approximately 3.5 K.

While operating in the high-volume mode, evaporated coolant may be provided to the cryogen storage units 58 and/or the storage tank 62B from the reservoir 16. At process block 206, the coolant may also be provided to the storage tanks 62A, 62B of the auxiliary cryogen storage system 60 while operating in low-volume mode. For example, coolant captured during the ramp-up at the cryogen storage units 58 may be provided the storage tanks 62A, 62B of the auxiliary cryogen storage system 60. The activated charcoal of the storage tanks 62A, 62B may absorb the coolant. Thus, the auxiliary cryogen storage system 60 will have coolant (e.g., liquid and/or gaseous liquid helium), thereby enabling the thermosiphon cooling system 10 to return to operating in the high-volume mode of operation, if desired, subsequent to operating in the low-volume mode. For instance, should a user of an MRI system want to capture MRI data (e.g., images) to perform MGI sequences, the thermosiphon cooling system 10 may switch to operating in the high-volume mode. Additionally, it should be noted that coolant can be returned to the auxiliary cryogen storage system 60 from the cryogen storage units 58 while operating in high-volume mode. However, because the temperature of the auxiliary cryogen storage system 60 is relatively higher (e.g., compared to when operating in the low-volume mode), the coolant may be gaseous. It should also be noted that, at process block 206, the auxiliary cryogen storage system 60 may continue to receive coolant. That is, the auxiliary cryogen storage system 60 may receive coolant directly from reservoir 16 instead of from the cryogen storage units 58.

Accordingly, the presently disclosed techniques enable on-demand cooling to be provided to a system. For instance, as discussed above, an MRI system (e.g., that includes superconducting unit 12) may be provided with various amounts of coolant (e.g., liquid helium) in response to the demand for cooling the superconducting unit 12 changing. For example, while in a steady-state, the system may operate using a relatively small amount of coolant (e.g., in low-volume mode). If more coolant is desired, additional coolant can be provided to the reservoir 16 from the auxiliary cryogen storage system 60 to cool the superconducting unit 12 (e.g., by operating in the high-volume mode). Additionally, as noted above, liquid coolant that evaporates can be returned to the auxiliary cryogen storage system 60. Therefore, the present techniques also enable coolant to effectively be recycled within the thermosiphon cooling system 10. Due to this, relatively lower amount of coolant may be utilized (e.g., compared to cooling systems that do not include the auxiliary cryogen storage system 60), which may reduce the weight of the thermosiphon cooling system 10. Furthermore, because the coolant provided by the auxiliary cryogen storage system 60 is a relatively low temperature, less time may be to cool the coolant compared to systems in which received coolant has a higher temperature, thereby reducing the amount of time used cool coolant received from the auxiliary cryogen storage system 60.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A cooling system, comprising:
   a superconducting unit;
   a reservoir configured to store liquid coolant to cool the superconducting unit;
   an auxiliary storage system comprising one or more storage tanks fluidly coupled to the reservoir, wherein the auxiliary storage system is configured to:
   provide additional coolant to the reservoir;
   receive and store coolant from the reservoir;
   wherein:
   the auxiliary storage system comprises a thermal switch configured to enable a flow of the additional coolant to the reservoir;
   the cooling system comprises a control system configured to control the thermal switch to modify a temperature of the additional coolant while being stored in the one or more storage tanks; and wherein:
   the additional coolant is stored within the one or more tanks in a liquid state; and
   the control system is configured to cause the temperature of the additional coolant to increase and cause the additional coolant to have a gaseous state prior to entering the reservoir.

2. The cooling system of claim 1, wherein the one or more storage tanks comprise activated charcoal.

3. The cooling system of claim 1, wherein the one or more storage tanks comprise zeolites.

4. The cooling system of claim 1, wherein the auxiliary storage system is configured to provide the additional coolant when the superconducting unit is ramping up and receive the coolant after the superconducting unit has finished ramping up.

5. The cooling system of claim 1, comprising a condensing unit configured to condense the additional coolant from the gaseous state to the liquid state before the additional coolant enters the reservoir.

6. The cooling system of claim 1, wherein the coolant comprises helium.

7. An imaging system comprising:
   a superconducting unit;
   a thermal shield configured to shield the superconducting unit from thermal radiation;
   a reservoir configured to store liquid coolant to cool the superconducting unit; and
   an auxiliary storage system comprising one or more storage tanks fluidly coupled to the reservoir, wherein the auxiliary storage system is configured to:
   provide additional coolant to the reservoir;
   receive and store coolant from the reservoir;
   wherein:
   the one or more storage tanks comprise a first tank;
   the auxiliary storage system comprises a first thermal switch configured to thermally couple the first tank and the thermal shield to one another;
   the imaging system further comprises a cooling system configured to cool the superconducting unit, wherein:
   the one or more storage tanks comprise a second tank different from the first tank; and
   the auxiliary storage system comprises a second thermal switch different from the first thermal switch, wherein the second thermal switch is configured to thermally couple the second tank and the cooling system to one another.

8. The imaging system of claim 7, wherein the auxiliary storage system comprises a first sorb configured to provide coolant to the first thermal switch.

9. The imaging system of claim 8, wherein the first tank is configured to provide the additional coolant to the reservoir after receiving coolant from the first sorb.

10. The imaging system of claim 7, wherein:
    in a first mode of operation:
    the first tank is thermally coupled to the thermal shield via the first thermal switch;
    the second tank is not thermally coupled to the cooling system via the second thermal switch; and
    the first tank provides the additional coolant to the reservoir; and
    in a second mode of operation:
    the first tank is not thermally coupled to thermal shield via the first thermal switch;
    the second tank is thermally coupled to the cooling system via the second thermal switch; and
    the second tank provides the additional coolant to the reservoir.

11. The imaging system of claim 10, wherein, in the second mode of operation, the first tank is configured to receive the coolant from the reservoir.

12. The imaging system of claim 10, comprising a control system having processing circuitry communicatively coupled to the first thermal switch and second thermal switch, wherein the processing circuitry is configured to cause coolant to be provided to the first thermal switch to thermally couple the first tank to the thermal shield.

13. A method, comprising:
    providing coolant to a first thermal switch of an auxiliary storage system, wherein the auxiliary storage system comprises one or more storage tanks fluidly coupled to a reservoir configured to store liquid coolant used to cool a superconducting unit, wherein providing coolant to the first thermal switch causes a first tank of the one or more storage tanks to become thermally coupled to a thermal shield;
    performing a ramp-up of the superconducting unit; and
    providing coolant from the first tank to the reservoir in response to a temperature increase caused by performing the ramp-up.

14. The method of claim 13, comprising:
running one or more magnetic resonance imaging (MRI) sequences with high magnet gradient interaction (MGI); and
providing the coolant from the first tank to the reservoir in response to a temperature increase caused by running the one or more MRI sequences with high MGI.

15. The method of claim 13, wherein the temperature increase is a temperature increase of the thermal shield.

16. The method of claim 13, comprising evacuating coolant from a second thermal switch of the auxiliary storage system prior to performing the ramp-up.

* * * * *